United States Patent [19]
Kley

[11] Patent Number: 5,756,997
[45] Date of Patent: May 26, 1998

[54] SCANNING PROBE/OPTICAL MICROSCOPE WITH MODULAR OBJECTIVE/PROBE AND DRIVE/DETECTOR UNITS

[75] Inventor: Victor B. Kley, Berkeley, Calif.

[73] Assignee: General Nanotechnology, L.L.C., Berkeley, Calif.

[21] Appl. No.: 613,982

[22] Filed: Mar. 4, 1996

[51] Int. Cl.$^6$ ........................................ H01J 37/26
[52] U.S. Cl. ............................................... 250/306
[58] Field of Search ................................. 250/306, 307

[56]            References Cited
            U.S. PATENT DOCUMENTS

| 4,999,495 | 3/1991  | Miyata et al. | 250/306 |
| 5,142,145 | 8/1992  | Yasutake      | 250/306 |
| 5,260,824 | 11/1993 | Okada et al.  | 250/306 |
| 5,360,977 | 11/1994 | Onuki et al.  | 250/306 |
| 5,408,094 | 4/1995  | Kajimura      | 250/306 |
| 5,455,420 | 10/1995 | Ho et al.     | 250/306 |
| 5,463,897 | 11/1995 | Prater et al. | 73/105  |
| 5,510,615 | 4/1996  | Ho et al.     | 250/306 |
| 5,560,244 | 10/1996 | Prater et al. | 250/306 |

*Primary Examiner*—Bruce Anderson
*Attorney, Agent, or Firm*—Flehr Hohbach Test Albritton & Herbert LLP.

[57] ABSTRACT

A scanning probe and optical microscope for inspecting an object the comprises a microscope stand to support the object, a modular objective/probe unit, a modular drive/detector unit, and an optical observation head. The modular objective/probe unit is removably attached to the microscope stand and comprises a probe with a cantilever and a tip on the cantilever. It also comprises a movement mechanism attached to the cantilever to move the cantilever so that the tip is moved over the object. It further comprises objective optics. The modular detector unit is removably attached to the microscope stand and comprises detection optics optically coupled to the objective optics. The detection optics direct deflection detecting light to the objective optics which focus the deflection detecting light on the cantilever so that the cantilever reflects the deflection detecting light as the tip is moved over the object. The objective optics direct the reflected deflection detecting light to the detection optics so that the detection optics detects the reflected deflection detecting light for measuring the deflection of the cantilever as the tip is moved over the object. The optical observation head comprises image forming optics optically coupled to the objective optics. The image forming optics direct object observing light to the objective optics which focus the object observing light on the object so that the object reflects the object observing light. The objective optics direct the reflected object observing light to the image forming optics so that the image forming optics focus the reflected object observing light to form an image of the object for observation.

11 Claims, 4 Drawing Sheets

SCANNING PROBE/OPTICAL MICROSCOPE WITH MODULAR OBJECTIVE/PROBE AND DRIVE/DETECTOR UNITS

FIELD OF THE INVENTION

The present invention relates generally to scanning probe and optical microscopes. In particular, it relates to a combined scanning probe/optical microscope that has modular objective/probe and modular drive/detector units.

BACKGROUND OF THE INVENTION

In the past, microscopes capable of performing optical microscopy and scanning probe microscopy (SPM) have been limited in the ability to combine and use the modularity of modern optical microscope components. In these microscopes, the entire scanning probe subsystem and the objective components of the optical subsystem are typically packaged in one clumsy objective unit with restrictive electrical connections which limit the effectiveness and usefulness of the microscope. Furthermore, the entire objective unit in these microscopes must be replaced in order to change the effective scan range of the scanning probe subsystem at substantial expense.

SUMMARY

The foregoing problems are solved by a scanning probe and optical microscope for inspecting an object that comprises a microscope stand to support the object, a modular objective/probe unit, a modular drive/detector unit, and an optical observation head.

The modular objective/probe unit is removably attached to the microscope stand. The modular objective/probe unit comprises a probe with a cantilever and a tip on the cantilever. It also comprises a movement mechanism attached to the cantilever to move the cantilever so that the tip is moved over the object. It further comprises objective optics.

The modular detector unit is removably attached to the microscope stand. The modular detector unit comprises detection optics optically coupled to the objective optics. The detection optics direct deflection detecting light to the objective optics. The objective optics focus the deflection detecting light on the cantilever so that the cantilever reflects the deflection detecting light as the tip is moved over the object. The objective optics direct the reflected deflection detecting light to the detection optics so that the detection optics detects the reflected deflection detecting light for measuring the deflection of the cantilever as the tip is moved over the object.

The optical observation head comprises image forming optics optically coupled to the objective optics. The image forming optics direct object observing light to the objective optics. The objective optics focus the object observing light on the object so that the object reflects the object observing light. The objective optics direct the reflected object observing light to the image forming optics so that the image forming optics focus the reflected object observing light to form an image of the object for observation.

In one embodiment, the microscope includes a plurality of the modular objective/probe units just described. In this embodiment, the microscope stand comprises a support structure to support the object and a nosepiece rotatably attached to the support structure. The modular objective/probe units are removably attached to the nosepiece. The object is inspected, in the manner just described, with one of the modular objective/probe units selected by rotating the nosepiece so that the selected one of the modular objective/probe units is over the object.

In another embodiment, the microscope comprises a modular scanning probe unit and a modular objective unit both removably attached to the nosepiece. The scanning probe unit comprises a probe with a cantilever and a tip on the cantilever. It also comprises a movement mechanism coupled to the cantilever. The modular objective unit comprises objective optics. The object is inspected with one of the modular objective and scanning probe units selected by rotating the nosepiece so that the selected one of the modular objective and scanning probe units is over the object.

The microscope in this embodiment further comprises drive/measure circuitry electrically coupled to the detection optics and the movement mechanism when the scanning probe unit is selected. The drive/measure circuitry drives the movement mechanism to move the cantilever so that the tip is moved over the object for making scanning probe microscopy measurements when the scanning probe unit is selected.

The image forming optics of the observation head are optically coupled to the objective optics when the modular objective unit is selected. The image forming optics directing object observing light to the objective optics. The objective optics focuses the object observing light on the object so that the object reflects the object observing light. The objective optics direct the reflected object observing light to the image forming optics so that the image forming optics focuses the reflected object observing light for observation.

DETAILED DESCRIPTION OF THE INVENTION

Figure 1:
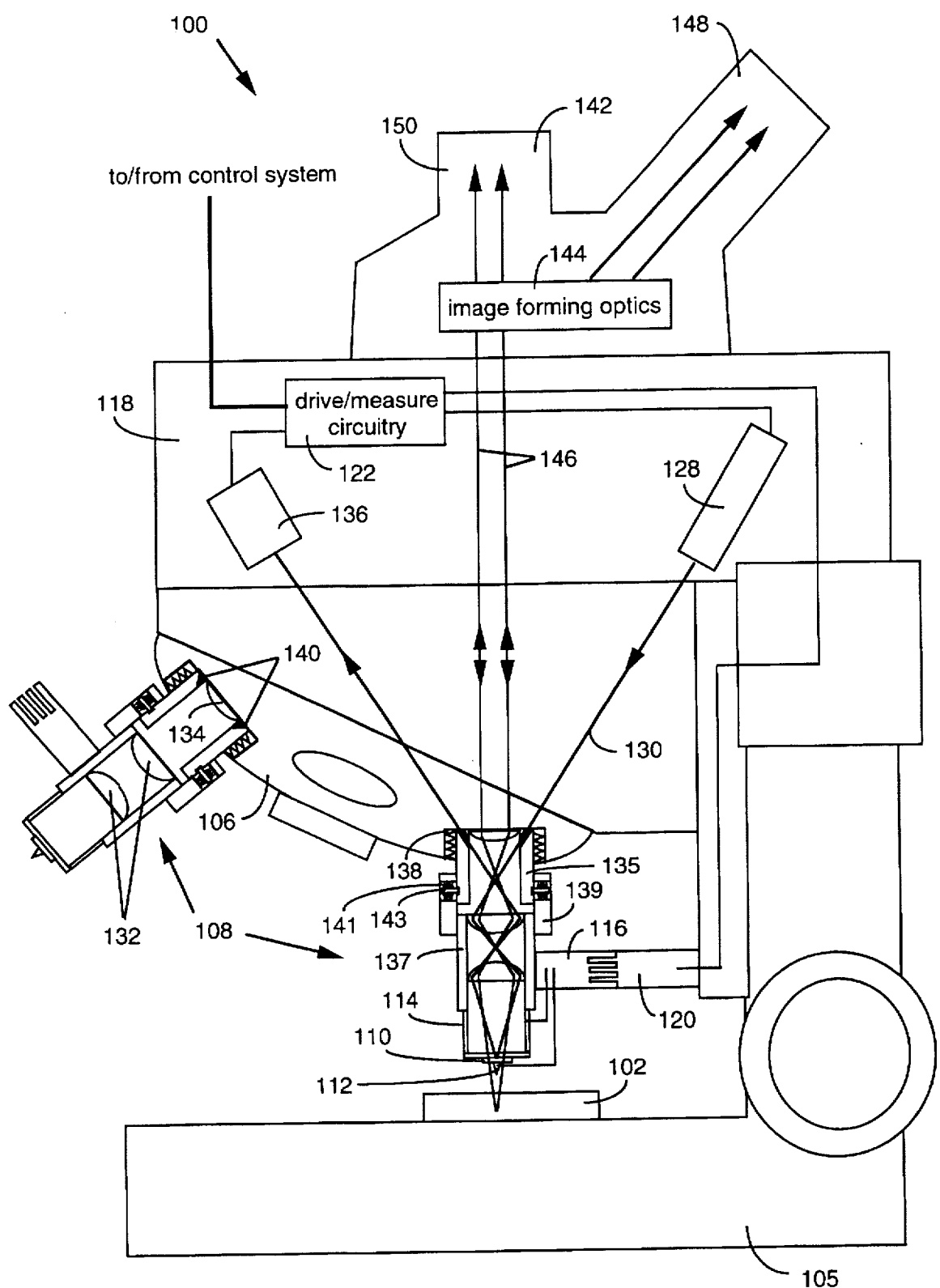
FIG. 1 shows a scanning probe/optical microscope in accordance with the present invention.

Referring to FIG. 1, there is shown one embodiment of a combined canning probe/optical microscope 100 for inspecting an object 102. Specifically, the microscope is configured to perform SPM (i.e., atomic force, lateral force, magnetic force, near-field, and/or scanning tunneling microscopy) and optical microscopy (i.e., confocal or conventional optical microscopy) on the object. Many of these forms of microscopy may be combined as described in copending U.S. patent application Ser. No. 08/281,883 filed on Jul. 28, 1994, which is hereby explicitly incorporated by reference.

The microscope 100 comprises a standard optical microscope stand that includes a support structure 105 and a nosepiece 106. The support structure supports the object 102 and the other components of the microscope including the nosepiece. The nosepiece is rotatably attached to the support structure.

Figure 2:
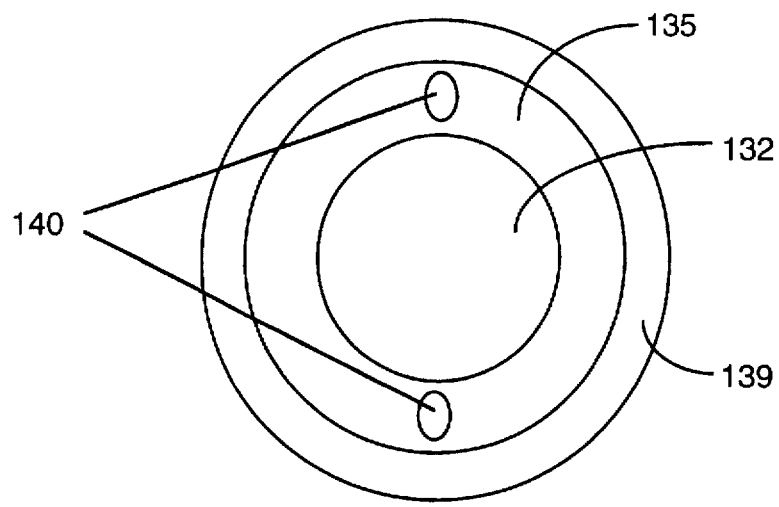
FIG. 2 shows a bottom view of a modular objective unit of the microscope of FIG. 1.

The microscope also comprises modular objective/probe units (i.e., subsystems or attachments) 108 which are interchangeably and removably attached to the nosepiece. For performing an SPM scan of the object 102, each modular objective/probe unit 108 comprises an XYZ translator (i.e., movement mechanism) 114 and an SPM probe formed by a cantilever 110 and a tip 112 on the cantilever. An electrical contact structure 116 is attached to each modular objective/probe unit and is electrically coupled to the XYZ translator of that modular objective/probe unit. Moreover, as shown in FIG. 2, the cantilever is attached to the XYZ translator.

Referring back to FIG. 1, the microscope 100 further comprises a modular drive/detector unit (i.e., subsystem or attachment) 118 and a stationary electrical contact structure 120 which are both attached to support structure 105. The drive/detector unit comprises drive/measure circuitry 122 that is electrically coupled to the stationary electrical contact structure and to a control system of the microscope. The stationary electrical contact structure 120 is engaged with or connected to-the rotatable electrical contact structure 116 attached to the modular objective/probe unit 108 being used to inspect the object with. In response to scanning control signals from the control system, the drive/measure circuitry drives the modular objective/probe unit's XYZ translator 114 to move the cantilever 110 during an SPM scan. As a result, the tip 112 is moved over the object to perform the SPM scan.

When the microscope 100 is performing atomic force, lateral force, or magnetic force microscopy during an SPM scan, the deflection of the cantilever 110 during the SPM scan is used by the control system to form an image of the object 102. And, in the case where near-field or scanning tunneling microscopy is being performed, the deflection of the cantilever is used by the control system in positioning the cantilever during the SPM scan.

In order to detect and measure the deflection of the cantilever during the SPM scan, the modular drive/detector unit 118 also comprises cantilever deflection detection optics. The detection optics comprise a light source 128, such as a laser. In response to scanning control signals from the control system, the drive/measure circuitry 122 drives the light source to provide a narrow beam of light 130 to be used in detecting the deflection of the cantilever 110 when the tip 112 is moved over the object 102 during the SPM scan. This light is directed to the modular objective/probe unit 108 being used to inspect the object with.

Figure 3:
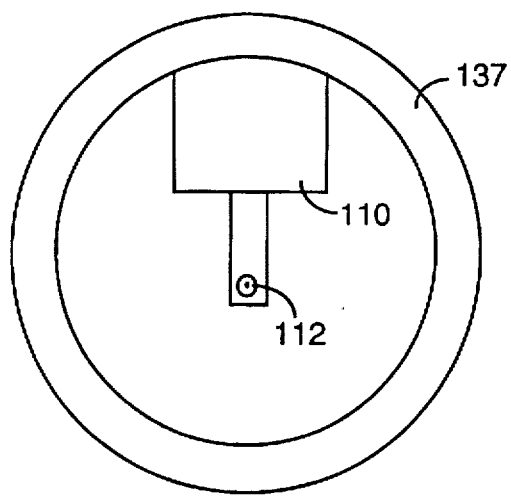
FIG. 3 shows a top view of a modular objective unit of the microscope of FIG. 1.

Each modular objective/probe unit 108 also comprises objective optics optically coupled to the detection optics. The objective optics comprise objective lenses 132 and a relay lens 134 aligned along a common optical axis. The relay lens is housed in a cylindrical (i.e., tubular) base housing 135 which is attached to the nosepiece 106 while the objective lenses are housed in a cylindrical alignable housing 137. Referring to FIGS. 2 and 3, the objective optics further comprise apertures (i.e., holes) 136 in and at the top of the base housing. Between the apertures is the relay lens. As shown in FIG. 1, the light 130 is directed to the modular objective/probe unit 108 being used to inspect object 102 at an angle from the common optical axis (i.e., off axis) of the objective and relay lenses. The off axis light passes through one of the apertures and is provided to the objective lenses which focus the light on the cantilever 110. The light is reflected by the cantilever and directed by the objective lenses to the other aperture at an angle from the common optical axis. The off axis reflected light passes through the aperture to the modular drive/detector unit 118.

The detection optics further comprise a light detector 136, such as a photodetector. The light detector detects the reflected light 130 and converts it to an electrical signal provided to the drive/measure circuitry 122. In response, the drive/measure circuitry measures the deflection of the cantilever 110 and provides a signal representing this deflection to the control system over the cable 114 so that the control system can use it in the manner described earlier.

Referring back to FIG. 1, as indicated earlier, the modular objective/probe units 108 are removably attached to the nosepiece 106. In order to do so, the nosepiece has several spaced apart receptacles 138 for receiving the attachable housings 135 of the modular objective/probe units. Since the receptacles and the attachable housings have threads, the modular objective/probe units can be easily screwed into and out of the receptacles of the nosepiece. Moreover, as also indicted earlier, the nosepiece is rotatably attached to the microscope stand 104. Thus, a user can easily replace one modular objective/probe unit with another for inspecting the object 102. This is done by first rotating the nosepiece so that the modular objective/probe unit being replaced is no longer over the object and the electrical connectors 116 and 120 are no longer engaged. This modular objective/probe unit is then unscrewed from the nosepiece. The modular objective/probe unit selected for inspecting the object with is then screwed into the nosepiece and the nosepiece is rotated so that this modular objective/probe unit is properly aligned over the object. At the same time, the electrical contact structure 116 for the selected modular objective/probe unit rotates with the nosepiece and engages the stationary electrical contact structure 120. As a result, an electrical connection between the drive/measure circuitry 122 and the XYZ translator 114 of the selected modular objective/probe unit is made. And, in the case where the microscope 100 is configured to perform STM and the tip 112 is conductive, the engagement of the electrical contact structures 116 and 120 also makes an electrical connection between the drive/measure circuitry and the conductive tip 112.

In addition, each modular objective/probe unit 108 further includes a cylindrical alignment collar 139 with receptacles 141 for receiving the threaded screws 143. Since the receptacles have threads, the threaded screws are screwed into the receptacles so that their ends contact the base housing 135. The alignment collar is attached to the alignable housing 137 and, as indicated earlier, the cantilever 110 is attached to the XYZ translator 114 which is attached to the alignable housing. As a result, the threaded screws can be used to finely adjust or align the position of the cantilever with respect to the light source 128 of the modular drive/detector unit 118 so that the light 130 is properly directed at the cantilever. Additionally, the threaded screws can be used to properly align the electrical contact structure 116 with the electrical contact structure 120.

These features enables a user to easily perform an SPM inspection of the object 102 at different measurement resolutions. Specifically, a set of the modular objective units 108 having XYZ translators 114 with different ranges of movement (i.e., scanning ranges) in the X and Y directions in the plane of the object can be provided with the microscope 100. For example, the set of modular objective/probe units could be used to provide a maximum range of movement of 100 microns in the X and Y directions at different measurement resolutions. The first modular objective/probe unit could have a range of movement of 0–10 microns with a resolution of 0.5 angstroms, the second could have a range of movement of 0–20 microns with a resolution of 5 angstroms, the third having a range of movement of 0–30 microns with a resolution of 50 angstroms, etc. Thus, the modular objective/ probe unit with the highest measurement resolution (in X and Y) would be the one with the smallest range of movement.

The microscope 100 also comprises a conventional optical observation head 142 attached to the modular drive/detector unit 104. The optical observation head comprises conventional or confocal image forming optics 144 optically coupled to the objective optics of the modular objective/probe unit 108 being used to inspect the object 102 with and electrically coupled to the drive/measure circuitry 122.

The image forming optics 144 conventionally provides light 146, for optically observing the object 102 during an optical scan of the object. This light is directed along the common optical axis of the relay lens 134 and the objective lenses 132 of the modular objective/probe unit 108 being used to inspect the object with. The light is then directed by the relay lens 134 to the objective lenses 132 which focus the light on the object. The light reflected by the object is then directed by the objective lenses to the relay lens. The relay lens relays the reflected light to the image forming optics which then focus the light so as to form an optical image of the object. This optical image may be observed by a user at binocular observation ports 148 of the observation head and/or by a camera at a trilocular observation port 150.

Figure 4:
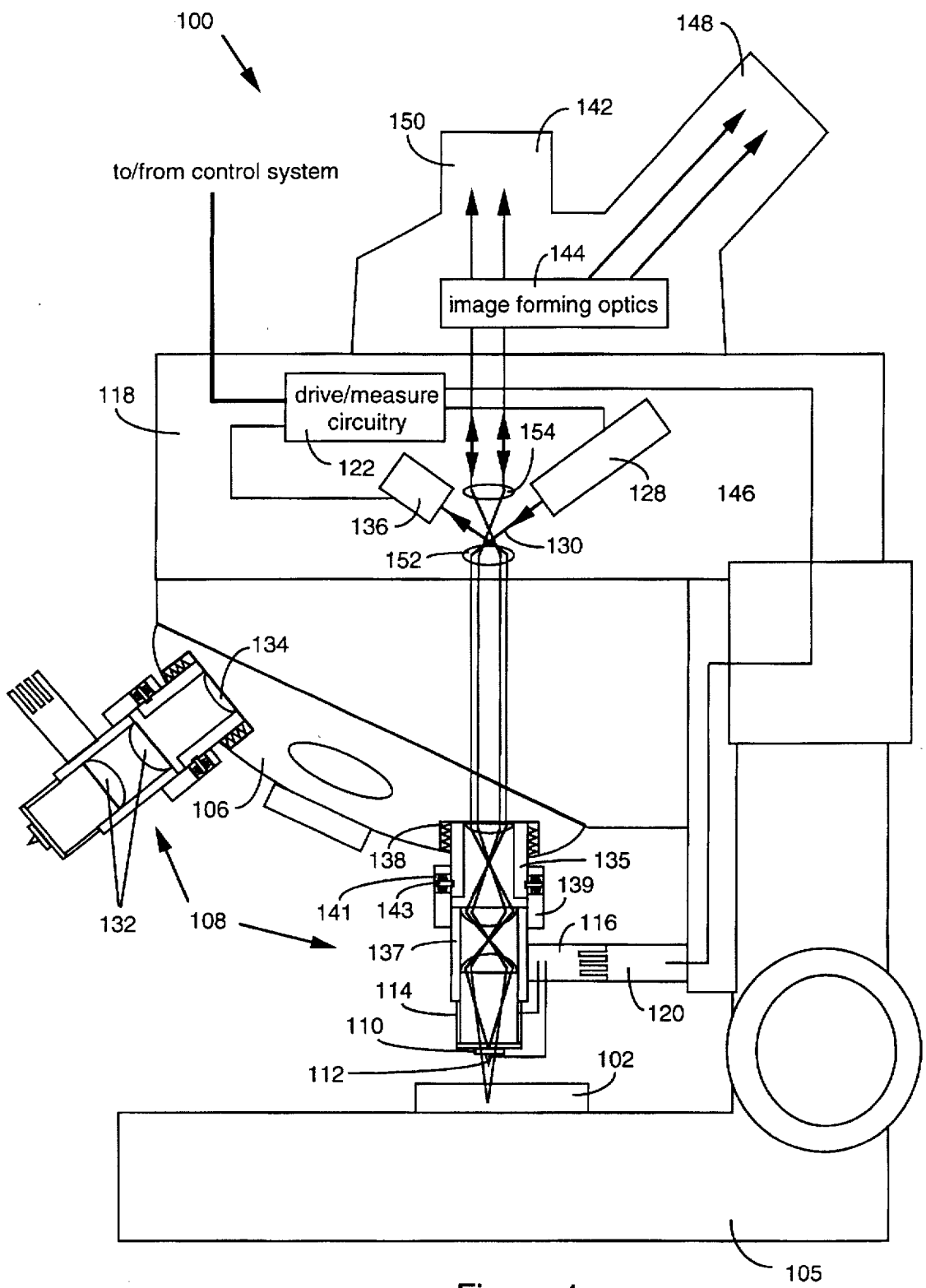
FIG. 4 shows another embodiment of a scanning probe/optical microscope in accordance with the present invention.

FIG. 4 shows an alternative embodiment of the microscope 100. In this embodiment, the cantilever deflection detection optics of the modular drive/detector unit 118 further comprises relay optics optically coupled to the image forming optics 144 of the observation head 142 and to the objective optics of the modular objective/probe unit 108 being used to inspect the object 102 with. The relay optics comprise relay lenses 152 and 154 aligned along the common optical axis of the objective and relay lenses 132 and 134 of the modular objective/probe unit.

For detecting deflection of the cantilever 110, the light source 128 directs a narrow beam of light 130 at the relay lens 152 which directs the light to the relay lens 134 of the modular objective/probe unit 108 being used to inspect the object 102 with. The light is then focused on and reflected by the cantilever in the manner described for the embodiment of FIG. 1. The reflected light is relayed by the relay lens 134 to the relay lens 152. The relay lens 152 relays the reflected light to the light detector 136 which detects the reflected light, as described for the embodiment of FIG. 1.

For forming an image of the object 102, the image forming optics 144 directs the light 146 it provides to the relay lens 154. The relays lens 154 then directs this light to the relay lens 152 which relays the light to the modular objective/probe unit 108 being used to inspect the object 102 with. This light is then focused on and reflected by the object in the manner described for the embodiment of FIG. 1. The reflected light is relayed by the relay lens 134 to the relay lens 152. The relay lens 152 directs the reflected light to the relay lens 154 which relays the reflected light to the image forming optics 144. The image forming optics then forms an optical image in the manner described earlier for the embodiment of FIG. 1.

In an alternative embodiment, the drive/measure circuitry 122 may be located external to the modular detector unit 118. In fact, the drive/measure circuitry may be part of the control system in this case.

Figure 5:
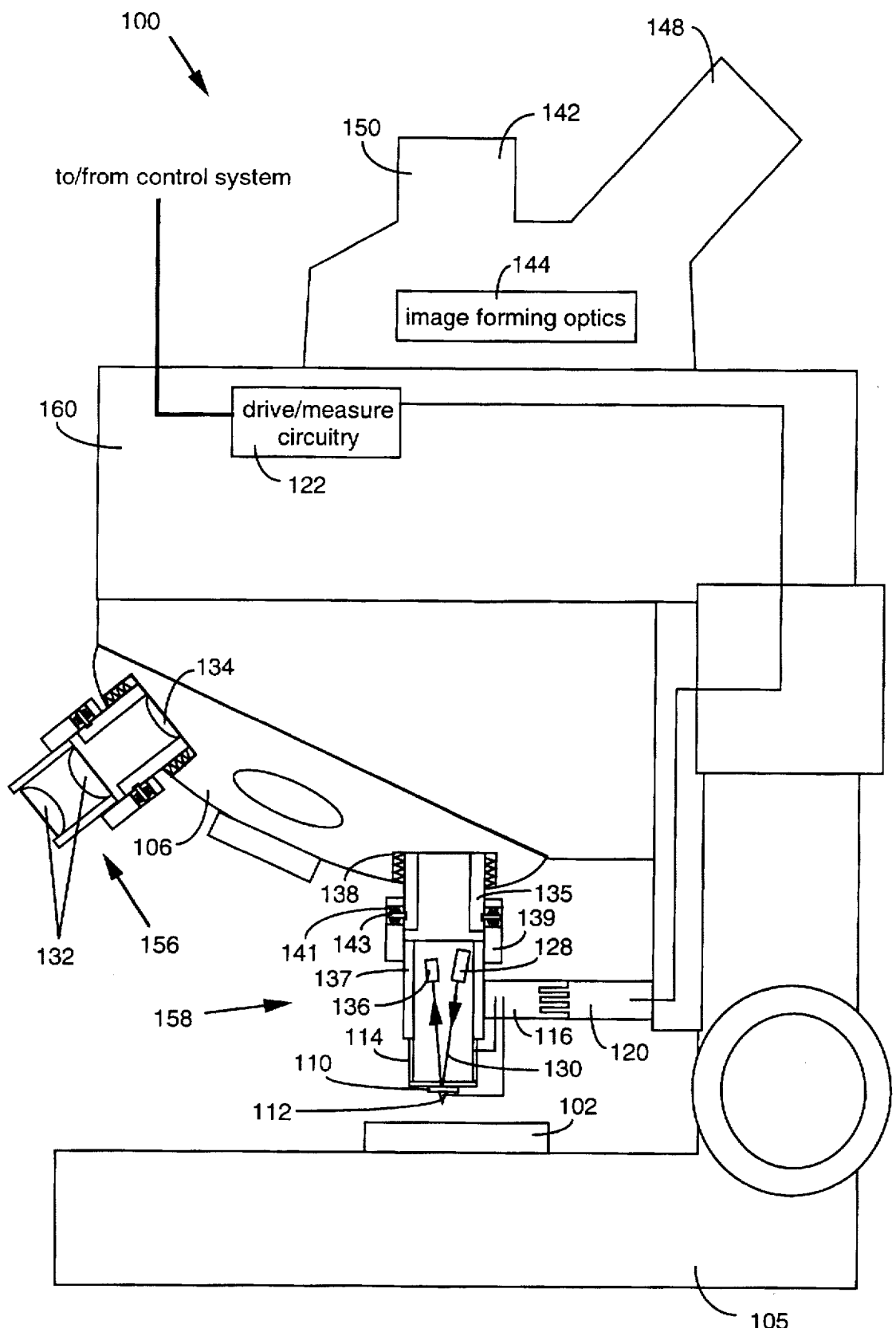
FIG. 5 shows still another embodiment of a scanning probe/optical microscope in accordance with the present invention.

Referring to FIG. 5, in another alternative embodiment, the microscope 100 may include modular objective units 156 and modular scanning probe units 158. The modular objective and scanning probe units are attached to the nosepiece 106 and selectable in a similar manner to that described earlier.

The modular scanning probe units 158 are constructed similar to the objective/probe units 108 described earlier except that the objective optics are replaced by the detection optics of the modular drive/detector unit 118 described earlier. The light source 128 and light detector 136 of the detection optics are configured and operate in a similar manner as that described earlier except that objective optics are not used to direct the deflection detecting light 130 to and from the cantilever 110. The drive/measure circuitry 122 in this embodiment may be located in a modular drive/measure unit 160 or externally in the control system. Moreover, in this embodiment, the electrical contact structures 116 and 120 provide an electrical connection between the drive/measure circuitry and the detection optics and XYZ translator 114 in a similar manner to that described earlier. And, in the case where the microscope performs STM, the electrical contact structures 116 and 120 provide an electrical connection between the drive/measure circuitry and the conductive tip 112.

The modular objective units 156 are also constructed similar to the objective/probe units 108 described earlier except that they do not include an XYZ translator and STM probe. The objective optics comprising the relay and objective lenses 132 and 134 are used in a similar manner to that described earlier for directing the object observing light to and from the object.

In another alternative embodiment, the rotatable electrical contact structure 116 for each modular objective/probe unit 108 is attached internally to the corresponding receptacle 138 of the nosepiece and the stationary electrical contact structure 120 is attached internally to the support structure. In such a configuration, each modular objective/probe unit would include concentric electrical contact rings separated by concentric insulation rings at the end of the base housing 135 where the relay lens 134 is located. Thus, when the modular objective/probe unit is screwed into the corresponding receptacle of the nosepiece, the concentric electrical contact rings make contact with the rotatable electrical contact structure for that modular objective/probe unit. Thus, when the modular objective/probe unit is screwed into the corresponding receptacle of the nosepiece and rotated into place, the stationary electrical contact structure engages the rotatable contact structure to provide the electrical connections between the modular detector unit 118 and the modular objective/probe unit described earlier. Additionally, the drive/measure circuitry 122 would include detection circuitry that would determine if there is high conductivity between the various contact fingers or elements of the rotatable contact structure. Referring to FIG. 5, if this is the case, then this means that one of the modular objective units 156 has been screwed into the corresponding receptacle of the nosepiece and the drive/measure circuitry will then not provide signals to drive an XYZ translator 114, measure the deflection of a tip 112, or measure tunneling currents with a tip of a modular objective/probe unit 108.

While the present invention has been described with reference to a few specific embodiments, the description is illustrative of the invention and is not to be construed as limiting the invention. For example, in other embodiments of the invention, the Furthermore, various other modifications may occur to those skilled in the art without departing from the true spirit and scope of the invention as defined by the appended claims.

What is claimed is:

1. A scanning probe/optical microscope for inspecting an object, the scanning probe/optical microscope comprising:

a microscope stand to support the object;

a modular objective/probe unit that are removably attachable to the microscope stand, the modular objective/probe unit comprising:
  a probe comprising a cantilever and a tip on the cantilever;
  a movement mechanism attached to the cantilever to move the cantilever so that the tip is moved over the object; and
  objective optics;
a modular detector unit that is separate from the modular objective/probe unit, is removably attachable to the microscope stand, and comprises detection optics; and
an optical observation head comprising image forming optics;
wherein when the object is being inspected with the modular objective/probe unit,
(a) the modular detector unit and the modular objective/probe unit are attached to the microscope stand so that the detection optics and the imaging forming optics are both optically coupled to the objective optics,
(b) the detection optics directs deflection detecting light to the objective optics, the objective optics focusing the deflection detecting light on the cantilever so that the cantilever reflects the deflection detecting light as the tip is moved over the object, the objective optics directing the reflected deflection detecting light to the detection optics so that the detection optics detects the reflected deflection detecting light for measuring the deflection of the cantilever as the tip is moved over the object;
(c) the image forming optics directs object observing light to the objective optics, the objective optics focusing the object observing light on the object so that the object reflects the object observing light, the objective optics directing the reflected object observing light to the image forming optics so that the image forming optics focuses the reflected object observing light to form an image of the object for observation.

2. A scanning probe/optical microscope as in claim 1 wherein:
  the detector unit further comprises drive/measure circuitry;
  when the object is being inspected with the modular objective/probe unit, (d) the modular detector unit and the modular objective/probe unit are attached to the microscope stand so that the drive/measure circuitry is electrically coupled to the detection optics and the movement mechanism, the drive/measure circuitry driving the movement mechanism to move the cantilever and the detection optics to provide the deflection detecting light, the drive/measure circuitry measuring the deflection of the cantilever from the reflected deflection detecting light detected by the detection optics.

3. A scanning probe/optical microscope as in claim 1 wherein:
  the detection optics comprises a light source and a light detector;
  the objective optics comprises:
    a relay lens;
    one or more objective lenses aligned along a common optical axis with the relay lens; and
    a pair of apertures;
  when the object is being inspected with the modular objective/probe unit, (d) the image forming optics directs the object observing light to the relay lens so that the relay lens directs the object observing light to the objective lenses, the objective lenses focusing the object observing light on the object and directing the reflected object observing light to the relay lens, the relay lens relaying the reflected object observing light to the image forming optics.
(e) the light source directing the deflection detecting light to the objective lenses through a first one of the apertures at an angle to the common optical axis, the objective lenses focusing the deflection detecting light on the cantilever and directing the reflected deflection detecting light through a second one of the apertures to the light detector at an angle to the common optical axis.

4. A scanning probe/optical microscope as in claim 1 wherein the detection optics comprises:
  a light source;
  a light detector; and
  relay optics;
  wherein when the object is being inspected with the modular objective/probe unit,
  (d) the relay optics are optically coupled to the image forming optics, the objective optics, the light source, and the light detector.
  (e) the light source directs the deflection detecting light to the relay optics so that the relay optics relays the deflection detecting light to the objective optics, the objective optics directing the reflected deflection detecting light to the relay optics so that the relay optics relays the reflected deflection detecting light to the light detector;
  (f) the image forming optics directs the object observing light to the relay optics so that the relay optics relays the object observing light to the objective optics, the objective optics directing the reflected object observing light to the relay optics so that the relay optics relays the reflected object observing light to the image forming optics.

5. A scanning probe/optical microscope for inspecting an object, the scanning probe and optical microscope comprising:
  a microscope stand comprising:
    a support structure to support the object; and
    a nosepiece rotatably attached to the support structure;
  a plurality of modular objective/probe units that are each removably attachable to the nosepiece, each of the modular objective/probe units comprising:
    a probe comprising a cantilever and a tip on the cantilever;
    a movement mechanism coupled to the cantilever; and
    objective optics;
  a modular detector unit that is separate from the modular objective/probe units, is removably attachable to the support structure, and comprises detection optics; and
  an optical observation head comprising image forming optics;
  wherein when the object is being inspected with a selected one of the modular objective/probe units,
  (a) the modular detector unit is attached to the microscope stand,
  (b) the selected one of the modular objective/probe units is attached to the nosepiece and the nosepiece is rotated so that the selected one of the modular objective/probe units is over the object and the detection optics and the imaging forming optics are both optically coupled to the objective optics, (c) the movement mechanism of the selected one of the modular objective/probe units moves the cantilever of the selected one of the modular objective/probe units so that the tip of the selected one of the modular objective/probe units is moved over the object, (d) the detection optics directs deflection detecting light to the objective optics of the selected one of the modular objective/probe units, the objective optics of the selected one of the modular objective/probe units focusing the deflection detecting light on the cantilever of the selected one of the modular objective/probe units so that the cantilever of the selected one of the modular objective/probe units reflects the deflection detecting light as the tip of the selected one of the modular objective/probe units is moved over the object, the objective optics of the selected one of the modular objective/probe units directing the reflected deflection detecting light to the detection optics so that the detection optics detects the reflected deflection detecting light for measuring the deflection of the cantilever of the selected one of the modular objective/probe units as the tip of the selected one of the modular objective/probe units is moved over the object; and (e) the image forming optics directs object observing light to the objective optics of the selected one of the modular objective/probe units, the objective optics of the selected one of the modular objective/probe units focusing the object observing light on the object so that the object reflects the object observing light, the objective optics of the selected one of the modular objective/probe units directing the reflected object observing light to the image forming optics so that the image forming optics focuses the reflected object observing light for observation.

6. A scanning probe/optical microscope as claimed in claim 5 wherein:

the modular detector unit further comprises drive/measure circuitry;

when the object is being inspected with the selected one of the modular objective/probe units, (f) the modular detector unit and the selected one of the modular objective/probe units are attached to the microscope stand so that the drive/measure circuitry is electrically coupled to the detection optics and the movement mechanism of the selected one of the modular objective/probe units, the drive/measure circuitry driving the movement mechanism of the selected one of the modular objective/probe units to move the cantilever and the detection optics to provide the deflection detecting light, the drive/measure circuitry measuring the deflection of the cantilever of the selected one of the modular objective/probe units as the tip of the selected one of the modular objective/probe units is moved over the object from the reflected deflection detecting light detected by the detection optics.

7. A scanning probe/optical microscope as claimed in claim 6 further comprising:

a stationary electrical contact structure attached to the support structure and electrically coupled to the drive/measure circuitry;

for each respective one of the modular objective/probe units, a corresponding electrical contact structure that is attached to the respective one of the modular objective/probe units and is electrically coupled to the movement mechanism of the respective one of the modular objective/probe units;

wherein when the object is being inspected with the selected one of the modular objective/probe units, (g) the corresponding electrical contact structure for the selected one of the modular objective/probe units rotates and engages the stationary electrical contact structure to electrically couple the movement mechanism of the selected one of the modular objective/probe units and the drive/measure circuitry when the nosepiece is rotated so that the selected one of the modular objective/probe units is over the object.

8. A scanning probe/optical microscope as claimed in claim 6 further comprising:

a stationary electrical contact structure attached to the support structure and electrically coupled to the drive/measure circuitry;

a rotatable electrical contact structures that are attached to the nosepiece and rotate when the nosepiece is rotated;

the nosepiece including a corresponding receptacle for each of the rotatable electrical contact structures for removably attaching the respective one of the modular objective/probe units to the nosepiece so that the corresponding one of the rotatable electrical contact structures is electrically coupled to the movement mechanism of the respective one of the modular objective/probe units;

wherein when the object is being inspected with the selected one of the modular objective/probe units, (g) the selected one of the modular objective/units is removably attached to the nosepiece with a corresponding one of the receptacles so that the corresponding one of the rotatable electrical contact structures is electrically coupled to the movement mechanism of the selected one of the modular objective/probe units;

(h) the corresponding one of the rotatable electrical contact structures rotates and engages the stationary electrical contact structure to electrically couple the movement mechanism of the selected one of the modular objective/probe units and the drive/measure circuitry when the nosepiece is rotated so that the selected one of the modular objective/probe units is over the object.

9. A scanning probe/optical microscope as in claim 5 wherein:

the detection optics comprises a light source and a light detector;

the objective optics of each of the modular objective/probe units comprises:
a relay lens;
one or more objective lenses aligned along a common optical axis with the relay lens; and
a pair of apertures;

when the object is being inspected with the selected one of the modular objective/probe units, (f) the image forming optics directs the object observing light to the relay lens of the selected one of the modular objective/probe units so that the relay lens of the selected one of the modular objective/probe units directs the object observing light to the objective lenses of the selected one of the modular objective/probe units, the objective lenses of the selected one of the modular objective/probe units focusing the object observing light on the object and directing the reflected object observing light to the relay lens of the selected one of the modular objective/probe units, the relay lens of the selected one of the modular objective/probe units relaying the reflected object observing light to the image forming optics, (g) the light source directs the deflection detecting light to the objective lenses of the selected one of the modular objective/probe units through a first one of the apertures of the selected one of the modular objective/probe units at an angle to the common optical axis in the selected one of the modular objective/probe units, the objective lenses of the selected one of the modular objective/probe units focusing the deflection detecting light on the cantilever of the selected one of the modular objective/probe units and directing the reflected deflection detecting light through a second one of the apertures of the selected one of the modular objective/probe units to the light detector at an angle to the common optical axis in the selected one of the modular objective/probe units.

10. A scanning probe/optical microscope as in claim 5 wherein the detection optics comprises:

a light source;

a light detector; and relay optics;

when the object is being inspected with the selected one of the modular objective/probe units, (f) the relay optics are optically coupled to the image forming optics, the objective optics of the selected one of the modular objective/probe units, the light source, and the light detector;

(g) the light source directs the deflection detecting light to the relay optics so that the relay optics relays the deflection detecting light to the objective optics of the selected one of the modular objective/probe units, the objective optics of the selected one of the modular objective/probe units directing the reflected deflection detecting light to the relay optics so that the relay optics relays the reflected deflection detecting light to the light detector;

(h) the image forming optics directs the object observing light to the relay optics so that the relay optics relays the object observing light to the objective optics of the selected one of the modular objective/probe units, the objective optics of the selected one of the modular objective/probe units directing the reflected object observing light to the relay optics so that the relay optics relays the reflected object observing light to the image forming optics.

11. A scanning probe/optical microscope as in claim 5 wherein the movement mechanisms of the modular objective/probe units provide varying movement ranges of the tip for varying measurement resolutions.

* * * * *